United States Patent
Itoh et al.

(10) Patent No.: US 7,488,540 B2
(45) Date of Patent: Feb. 10, 2009

(54) THIN FILM LAMINATE AND LUMINESCENT ELEMENT

(75) Inventors: Kiyoshi Itoh, Tokyo-to (JP); Daigo Aoki, Tokyo-to (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 43 days.

(21) Appl. No.: 10/787,572

(22) Filed: Feb. 26, 2004

(65) Prior Publication Data

US 2004/0166367 A1 Aug. 26, 2004

(30) Foreign Application Priority Data

Feb. 26, 2003 (JP) ............................. 2003-049590

(51) Int. Cl.
*B32B 27/00* (2006.01)
(52) U.S. Cl. .................. 428/500; 428/515; 428/516; 428/520; 428/522; 428/523; 365/110; 365/111
(58) Field of Classification Search .............. 428/500, 428/515, 516, 520, 522, 523; 365/110, 111
See application file for complete search history.

(56) References Cited

U.S. PATENT DOCUMENTS

| 5,688,855 | A | * | 11/1997 | Stoy et al. | .................. 524/505 |
| 6,001,531 | A | * | 12/1999 | Hasan et al. | ................. 430/212 |
| 6,368,730 | B1 | | 4/2002 | Kishimoto et al. | |
| 7,037,517 | B2 | * | 5/2006 | Kataoka et al. | ............. 424/427 |
| 2002/0096995 | A1 | | 7/2002 | Mishima et al. | |

FOREIGN PATENT DOCUMENTS

| EP | 1030383 | 8/2000 |
| EP | 1153739 | 11/2001 |

OTHER PUBLICATIONS

Search report mailed Aug. 13, 2004 for corresponding British Application No. GB0404296.6.

* cited by examiner

*Primary Examiner*—Leszek Kiliman
(74) *Attorney, Agent, or Firm*—Harness, Dickey & Pierce, PLC

(57) ABSTRACT

In a production process of a thin film laminate for constituting an organic EL element or the like, a thin film laminate is provided in which no water stays in a thin film formed of a hydrophilic material and, thus, the function of other thin films overlying the surface of the thin film, such as a luminescent layer, is not deteriorated. The thin film laminate comprises: a substrate; and, provided on the substrate in the following order, a first thin film and a second thin film. The first thin film is formed of a hydrophilic organic material. The hydrophilic organic material has hydrophilic groups which have been converted to lipophilic group. The lipophilic groups are partially or wholly returned to hydrophilic groups upon exposure to heat energy or a radiation. The second thin film is formed of a lipophilic organic material.

16 Claims, 1 Drawing Sheet

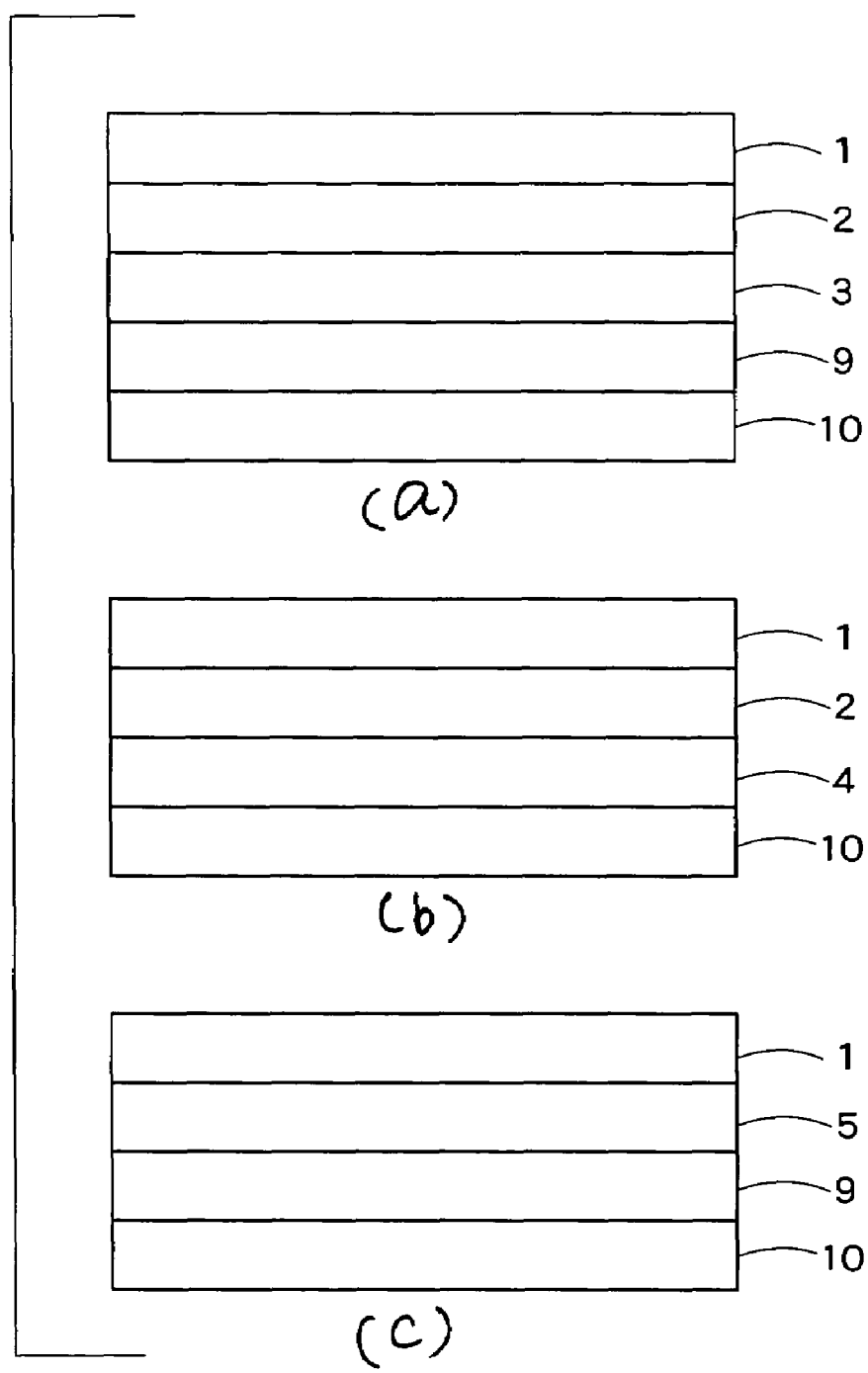
F I G. 1

THIN FILM LAMINATE AND LUMINESCENT ELEMENT

BACKGROUND OF THE INVENTION

1. Field of the Invention

The present invention relates to a thin film laminate and particularly to a luminescent element having the thin film laminate structure.

2. Background Art

A thin film laminate comprising a lipophilic material-containing thin film and a hydrophilic material-containing thin film stacked on top of each other has been developed. Specific examples of thin film laminates include luminescent elements, particularly electroluminescent elements (hereinafter referred to often as "EL elements").

The EL element comprises a pair of opposed electrodes and a luminescent layer held between the opposed electrodes. Recombination of electrons introduced from one of the electrodes and holes introduced through the other electrode in the luminescent layer induces luminescence of the luminescent layer. In 1963, M. Pope, H. P. Kallmann et al. have found that the application of a DC voltage to a single crystal of anthracene causes luminescence. This finding has led to full-scale research and development of the above element, and an organic EL element utilizing an organic thin film laminate structure was reported for the first time by T. W. Tang et al., KODAK, in 1987. Thereafter, a large number of research and development have been carried out with a view to improving the function of organic EL elements.

General layer construction of organic EL elements is shown in FIG. 1. The organic EL element generally comprises organic layers, i.e., an electron transport layer, a hole transport layer, and a luminescent layer, which greatly affect luminescent characteristics and color characteristics. The electron transport layer is formed of, for example, anthraquiodimethane. The hole transport layer is formed of, for example, phthalocyanine. The luminescent layer is formed of, for example, pyrene.

Most of organic EL elements include a hole transport layer and an organic luminescent layer. Materials used for constituting the hole transport layer in the organic EL element formed by coating are generally hydrophilic. Due to this nature of the material, the hole transport layer is formed by coating a coating liquid, prepared by dissolving or dispersing the layer forming material in water, onto a substrate. An organic luminescent layer is formed on the surface of the hole transport layer. Materials for organic luminescent layer formation are generally lipophilic. The organic luminescent layer is generally formed by dissolving or dispersing the layer forming material in an organic solvent to prepare a coating liquid and coating the coating liquid.

The organic EL element is generally likely to be influenced by moisture, and the performance of the element is often easily deteriorated by moisture. To avoid the performance deterioration, in many cases, effort has been made to satisfactorily seal the element for eliminating the adverse effect of the moisture. However, the hole transport layer is formed from a water-containing coating liquid. Therefore, removing water fully from the hole transport layer without leaving even a very small amount of water has been regarded as being very difficult because of the use of the hydrophilic material for the hole transport layer formation. Against this, in order to suppress the adverse effect of the very small amount of residual water within the hole transport layer, for example, a method has been adopted in which, in sealing the element, a moisture absorbent or the like is incorporated in the EL element structure. This method, however, is complicated and further is high in cost.

SUMMARY OF THE INVENTION

The present inventor has now found that, in a thin film laminate comprising a first thin film formed of a hydrophilic organic material and a second thin film formed of a lipophilic organic material stacked on top of each other, when a specific hydrophilic organic material is utilized in the formation of the first thin film, a laminate structure can be realized in which any moisture does not stay in the first thin film and, at the same time, the function of the second thin film provided on the surface of the first thin film is not deteriorated. The present invention has been made based on such finding. Accordingly, an object of the present invention is to provide a thin film laminate comprising a first thin film formed of a specific hydrophilic organic material and a second thin film formed of a lipophilic organic material which could have been stacked on top of each other without sacrificing the respective functions of the thin films.

Thus, according to a first aspect of the present invention, there is provided a thin film laminate comprising: a substrate; and, provided on the substrate in the following order, a first thin film and a second thin film, said first thin film being formed of a hydrophilic organic material, said hydrophilic organic material having hydrophilic groups which have been partially or wholly converted to lipophilic groups, said lipophilic groups being partially or wholly returned to hydrophilic groups upon exposure to heat energy or a radiation, said second thin film being formed of a lipophilic organic material.

According to a second aspect of the present invention, there is provided a process for producing a thin film laminate comprising: a substrate; and, provided on the substrate in the following order, a first thin film and a second thin film, said process comprising the steps of:

forming the first thin film on a surface of the substrate, said first thin film being formed of a hydrophilic organic material, said hydrophilic organic material having hydrophilic groups which have been partially or wholly converted to lipophilic groups, said lipophilic groups being partially or wholly returned to hydrophilic groups upon exposure to heat energy or a radiation;

simultaneously or after the formation of the first thin film, applying heat energy or a radiation to the first thin film to return a part or the whole of the lipophilic groups to hydrophilic groups; and then forming the second thin film.

According to a third aspect of the present invention, there is provided a liquid composition for thin film laminate formation, said liquid composition comprising a hydrophilic organic material, said hydrophilic organic material having hydrophilic groups which have been partially or wholly converted to lipophilic groups, said lipophilic groups being partially or wholly returned to hydrophilic groups upon exposure to heat energy or a radiation.

BRIEF DESCRIPTION OF THE DRAWING

FIG. 1 is a cross-sectional view showing an embodiment of the structure of an organic EL element.

DESCRIPTION OF REFERENCE CHARACTERS IN THE DRAWING

1: cathode, 2: electron (injection) transport layer, 3: luminescent layer, 4: hole (injection) transport layer which functions also as luminescent layer, 5: electron (injection) transport layer which functions also as luminescent layer, 9: hole (injection) transport layer, and 10: anode.

DETAILED DESCRIPTION OF THE INVENTION

Embodiments of the Invention

In one embodiment of the present invention, there are provided a production process of a thin film laminate for constituting an organic EL element or the like which no water stays in a thin film formed of a hydrophilic organic material and, thus, the function of other thin films overlying the surface of the thin film, such as a luminescent layer, is not deteriorated, and an organic EL element comprising a hole transport layer having a lowered water content.

More specifically, there is provided a process for producing a thin film laminate comprising at least a substrate, a first thin film formed of a hydrophilic organic material provided on the substrate, and a second thin film formed of a lipophilic material provided on the surface of the first thin film, the process comprising the steps of: forming the first thin film by coating a solution or dispersion of the hydrophilic organic material, of which the hydrophilic groups have been converted to lipophilic groups, in an organic solvent and drying the coating; after or simultaneously with the drying of the coating, exposing the first thin film to heat energy or a radiation to partially or wholly return the lipophilic groups to hydrophilic groups; and then forming the second thin film.

In another embodiment of the present invention, there is provided an organic EL element comprising at least a pair of opposed electrodes and, held between the pair of opposed electrodes, an organic carrier transport layer and an organic luminescent layer, wherein the number of water molecules (mass number: 18) contained in the organic hole transport layer is $1.0 \times 10^{16}$ or less as measured in a temperature range of 50 to 450° C. with a thermal desorption analyzer.

Details of the Invention

An embodiment of the thin film laminate according to the present invention will be described by taking an EL element, which is a luminescent element, as an example.

1. First Thin Film (Carrier Transport Layer)

In the present invention, a first thin film (carrier transport layer) is first formed either directly or through other layer(s) on the substrate. The material for carrier transport layer formation is a hydrophilic organic material. For example, an electron transport layer and a hole transport layer may be mentioned as the carrier transport layer in the EL element.

Hydrophilic organic materials for the hole transport layer include, for example, pyrazoline derivatives, arylamine derivatives, stilbene derivatives, and triphenyldiamine derivatives. Hydrophilic organic materials for the electron transport layer include, for example, oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorenone derivatives, diphenyldicyanoethylene or its derivatives, diphenoquinone derivatives, and 8-hydroxyquinoline or its derivatives, or metal complexes thereof.

In a preferred embodiment of the present invention, hydrophilic organic materials include polystyrenesulfonic acid or its derivatives and organic materials containing polystyrenesulfonic acid or its derivatives, and polythiophenesulfonic acid or its derivatives and organic materials containing polythiophenesulfonic acid or its derivatives. They are commercially available, and examples of commercially available products include poly(styrenesulfonate)/poly(2,3-dihydrothieno[3,4-b]-1,4-dioxine (available from Sigma-Aldrich) and sodium salt of poly[2-(3-thienyl)ethyloxy-4-butylsulfonate] (available from ADS).

Lipophilization of Hydrophilic Groups

Hydrophilic groups of the hydrophilic organic material for carrier transport layer formation include, for example, a sulfonic acid group, a carboxyl group, or a salt thereof. In the present invention, the hydrophilic group is converted to a lipophilic group. There are a large number of methods for lipophilizing the hydrophilic group to a lipophilic group. Preferably, a protection reaction method may be utilized.

In the protection reaction method, the functional group of the compound is previously subjected to physical-chemical treatment to render the compound nonreactive with or inert to a specific chemical reaction, and, after the completion of the contemplated chemical reaction, the reaction product is subjected to physical-chemical treatment to restore the original functional group.

An example of the utilization of the protection reaction method will be described. An example of the method for converting the sulfonic acid group, a carboxyl group, or a salt thereof to a lipophilic group is such that a sulfonic acid group, a carboxyl group, or a salt thereof is reacted with a chlorinating agent such as phosphorus pentachloride or thionyl chloride to convert this group or salt to a sulfochloride group or a carbonylchloride group which is then reacted with an alcohol such as methanol or ethanol for esterification. Another example of the protection reaction method is such that acetylation, tosylation, tritylation, alkylsilylation, alkylcarbonylation or the like may be used to lipophilize the sulfonic acid group, the carboxyl group, or its salt. This method is preferred. In the present invention, the sulfonic acid group, the carboxyl group, or its salt may be wholly lipophilized or alternatively may be preferably partially lipophilized to such an extent that the treated compound is dissolved in a general-purpose solvent.

Liquid Composition (Coating Liquid)

In a preferred embodiment of the present invention, there is provided a liquid composition usable for coating the carrier transport layer onto the surface of the substrate. This liquid composition comprises a hydrophilic organic material of which the hydrophilic groups have been partially or wholly converted to lipophilic groups, the lipophilic groups being partially or wholly returned to hydrophilic groups upon the application of heat energy or a radiation to the composition.

In the production process of the liquid composition, the hydrophilic organic material for carrier transport layer formation is first provided. The hydrophilic organic material is subjected to separation with stirring (preferably centrifugation), followed by vacuum drying to give a solid hydrophilic organic material. Next, the solid is esterified by a protection reaction. The esterification product is then isolated and purified. The purified material is then dissolved or dispersed, for example, in an organic solvent such as chloroform, methylene chloride, dichloroethane, tetrahydrofuran, toluene, or xylene to prepare a coating liquid as a liquid composition.

The concentration of the hydrophilic organic material in the coating liquid (solution or dispersion) as the liquid composition may vary depending upon ingredients or the composition. In general, however, the hydrophilic organic material is dissolved or dispersed in the solvent to a concentration of not less than 0.1% by mass, preferably about 3.0 to 5.0% by mass.

Coating

The coating liquid thus obtained is coated onto the substrate, and the coating is dried to form a coating film. In the coating film, any water is not used as the medium of the coating liquid, and, further, the coating film per se is not hydrophilic. Therefore, little or no water is present in the coating film. Furthermore, since no aqueous material is used, the preparation of the EL element can be carried out from first to last in an inert atmosphere. This advantageously contributes to the prevention of adsorption of moisture in the atmosphere during and after the preparation of the EL element.

Returning to Hydrophilic Groups

The lipophilic groups converted from the hydrophilic groups are returned to the original hydrophilic groups upon the application of heat energy or a radiation either simultaneously or after the formation of the first thin film (carrier transport layer). For example, as soon as the first thin film (carrier transport layer) is exposed to heat energy or a radiation, the ester bond is broken, whereby the esterified sulfonic acid group and/or the esterified carboxyl group are restored to the sulfonic acid group or the carboxyl group or the salt thereof.

The heat energy may be applied, for example, by heating at a temperature in the range of about 200 to 220° C. for about 60 to 90 min. This heat treatment may be carried out simultaneously with heat drying after the coating of the coating liquid. On the other hand, in the application of the radiation, for example, ultraviolet light and electron beams may be mentioned as the radiation. The ultraviolet light may be applied, for example, under conditions of not more than 300 nm (wavelength) and about 200 to 250 mJ/cm$^2$. The electron beam may be applied, for example, under conditions of not less than 500 kV and 35 mA.

Upon the above treatment, the ester bond is broken. As a result, the protective group escapes, and a proper carrier transport layer is formed. Also in this treatment, since water is not used at all, the carrier transport layer does not contain any water. Further, in the next step, a lipophilic (hydrophobic) thin film (for example, an organic luminescent layer) is formed on the surface of the carrier transport layer. Therefore, the adsorption of the moisture in the atmosphere onto the carrier transport layer can be prevented.

The EL element as an embodiment of the thin film laminate according to the present invention includes at least a pair of opposed electrodes and, held between the pair of opposed electrodes, a carrier transport layer (particularly a hole transport layer) and a luminescent layer. In this EL element, the number of water molecules (mass number: 18) contained in the hole transport layer is $1.0 \times 10^{16}$ or less as measured in a temperature range of 50 to 450° C. with a thermal desorption analyzer. When the water content of the hole transfer layer is in the above-defined content range, the service life of the EL element can be significantly improved. The thermal desorption analyzer used in the present invention is commercially available, and examples thereof include "TDS" manufactured by ULVAC, Inc. The measurement is carried out by SCAN measurement under conditions of measuring temperature range 50 to 450° C. and temperature rise rate 60° C./min.

When the hole transport layer in the EL element according to the present invention is formed by the above method, the water content of the hole transport layer is significantly lower than the water content of the conventional hole transport layer as measured under the same conditions as described above. Therefore, emission lifetime as the organic EL element is improved by about five times over that of the conventional organic EL element. This advantage is considered attributable to the water content of the hole transport layer.

When a hole transport layer is formed on a glass substrate through a transparent electrode, since the material for constituting the hole transport layer has many hydrophilic groups such as sulfonic acid group, in the prior art technique, the hole transport layer has been formed using a water dispersion of the material. In the hole transport layer formed by the conventional method, the water content in terms of mass number (M/z) 18 as measured under the same conditions as described above with the thermal desorption analyzer is much larger than $1.0 \times 10^{16}$.

2. Second Thin Film

In the present invention, a second thin film (a luminescent layer) is formed on the first thin film formed on the surface of the substrate. The material for second thin film (luminescent layer) formation is a lipophilic organic material. Lipophilic materials usable for luminescent layer formation include, for example, naphthalene derivatives, anthracene or its derivatives, perylene or its derivatives, dyes such as polymethine dyes, xanthene dyes, coumarine dyes, and cyanine dyes, aromatic amines, tetraphenylcyclopentadiene or its derivatives, or tetraphenylbutadiene or its derivatives. The luminescent layer may be formed from the luminescent material by any conventional method without particular limitation. Further, for example, the thickness of the luminescent layer may be a conventional one.

In the present invention, the luminescent layer formed of a lipophilic organic material is formed on the surface of the carrier transport layer formed of a hydrophilic organic material. Therefore, the luminescent layer functions also as a moisture barrier layer for the carrier transport layer, and, thus, the possibility for the adsorption of moisture present in the atmosphere in the carrier transport layer is significantly low. By virtue of this, unlike the prior art technique, for example, the provision of a complicated sealing step for embedding a moisture absorbent in the EL element can be eliminated.

The EL element according to the present invention may take other various forms so far as the construction is as described above. For example, in order to provide a planar luminescent organic EL element, a construction is preferably adopted wherein at least one of the pair of electrodes of an anode and a cathode is transparent or semitransparent and luminescence is taken out from the transparent or semitransparent electrode side. The construction, however, is not limited to this only when luminescence is taken out from the end face of the element.

3. Electrode (Anode)

For example, electrically conductive metal oxide films or thin metal films are used in the electrode (anode). Specifically, materials for the electrode include: electrically conductive metal oxides such as tin oxide, zinc oxide, indium oxide, and indium tin oxide (ITO); metals such as gold, silver, chromium, and nickel; organic electrically conductive materials such as polyaniline, polythiophene, and polypyrrole; and mixtures and laminates of the above materials. In particular, ITO is preferred as the anode, for example, from the viewpoint of high electrical conductivity and transparency.

4. Substrate

The substrate used in the present invention is a substrate which is used in various elements such as EL elements, and is usually a glass substrate. For example, in the case of an EL element, a glass substrate having on its surface a transparent electrode such as ITO may be used. In the present invention, these substrates may be used without particular limitation. In the EL element, when luminescence is taken out from the substrate side, preferably, the substrate is transparent or semitransparent and, at the same time, the electrode provided on the substrate in the pair of electrodes of the EL element is transparent or semitransparent. Materials for the substrate include quartz, glass plates such as soda glass plates, metallic plates or foils, and plastics such as acrylic resins, styrene resins, and polycarbonate resins.

Production Process of Thin Film Laminate (EL Element)

One embodiment of the production process of the thin film laminate (EL element) according to the present invention will be described.

An electrode (anode) is formed on a surface of a substrate (a transparent substrate). Next, a carrier transport layer and a luminescent layer are formed on this electrode. Particularly preferred methods for luminescent layer formation include coating methods using an organic solvent-type solution, dispersion, or mixed liquid, for example, spin coating, cast coating, dip coating, die coating, bead coating, bar coating, roll coating, spray coating, gravure coating, flexo printing, screen printing, and offset printing.

The thickness of the luminescent layer is 1 nm to 1 μm, preferably 2 to 500 nm, more preferably 5 to 200 nm. When the luminescent layer is formed by the coating method, preferably, heat drying at 30 to 300° C., preferably 60 to 200° C., under reduced pressure or in an inert atmosphere is carried out to remove the solvent.

When the luminescent layer and the carrier transport layer are stacked on top of each other, preferably, a hole transport layer is formed on the anode before the luminescent layer is provided by the above film forming method, or alternatively an electron transport layer is formed after the formation of the luminescent layer.

The carrier transport layer may be formed by any method without particular limitation. Preferably, however, the carrier transport layer is formed utilizing the above liquid composition according to the present invention in the form of a solution or dispersion in an organic solvent by spin coating, cast coating, dip coating, die coating, bead coating, bar coating, roll coating, spray coating, gravure coating, flexo printing, screen printing, and offset printing. The thickness of the carrier transport layer is 1 nm to 1 μm, preferably 2 to 500 nm, more preferably 5 to 200 nm.

Next, an electrode is provided on the luminescent layer or the carrier transport layer. This electrode is a cathode. The cathode is preferably formed of a material having a work function of less than 4 eV from the viewpoint of easiness in electron injection. Materials usable for the cathode include: alkali metals, for example, lithium, sodium, and cesium, and halides thereof, for example, lithium fluoride, sodium fluoride, cesium fluoride, lithium chloride, sodium chloride, and cesium chloride; alkaline earth metals, for example, calcium and magnesium, and halides thereof, for example, calcium fluoride, magnesium fluoride, calcium chloride, and magnesium chloride; metals such as aluminum and silver; electrically conductive metal oxides; and alloys or mixtures of the above materials.

The cathode may be prepared, for example, by vacuum deposition, sputtering, or lamination involving contact bonding of a metallic thin film. After the preparation of the cathode, a protective layer for protecting the EL element may be provided. The provision of a protective layer or a protective cover is preferred from the viewpoint of protecting the element from the external influence to stably use the organic EL element for a long period of time. Materials usable for the protective layer include polymeric compounds, metal oxides, metal fluorides, metal borides, silicon oxide, and silicon nitride. For example, a glass plate or a plastic plate having a surface subjected to water permeability reducing treatment may be used as the protective cover. A suitable method for the provision of the protective cover is that this cover is laminated onto the substrate of the element with the aid of a heat-curable resin or photocurable resin followed by hermetical sealing.

When the preparation of a sheet element using the EL element according to the present invention is contemplated, an anode sheet and a cathode sheet are put on top of each other. Methods for providing pattern-wise luminescence include a method wherein a mask having a window pattern is provided on the surface of the luminescent element sheet, a method wherein the thickness of the organic layer in the nonluminescent part is made very thick to render this part substantially nonluminescent, and a method wherein any one of the anode and the cathode is formed in a pattern form or alternatively both the anode and the cathode are formed in a pattern form.

Methods usable for the preparation of a dot matrix element include a method wherein both the anode and the cathode are formed in a stripe form and are disposed orthogonally to each other and a method wherein one of the electrodes is constructed so as to be selectively driven by TFT. Further, the arrangement of a plurality of organic EL elements different from each other in luminescent color in an identical plane can realize partial color display, multicolor display, and full-color display.

EXAMPLES

The following Examples and the like further illustrate the present invention but are not intended to limit it.

Example 1

Formation of First Thin Film (Hole Transport Layer)

A water dispersion of poly(styrenesulfonate)/poly(2,3-dihydrothieno[3,4-b]-1,4-dioxine (a reagent, manufactured by Sigma-Aldrich Co.) was treated by an OptimaXL-100K ultracentrifuge manufactured by Beckman Coulter, Inc. at 90,000 rpm for 5 hr (20° C.) to separate solid matter which was further collected by filtration and predried (150° C.×1 hr). The predried product was pulverized and post-dried under reduced pressure (150° C.×12 hr) to prepare a powder compound. It is considered that this power compound has a polymer composite structure of polyethylenedioxythiophene and polystyrenesulfonic acid represented by formula (I):

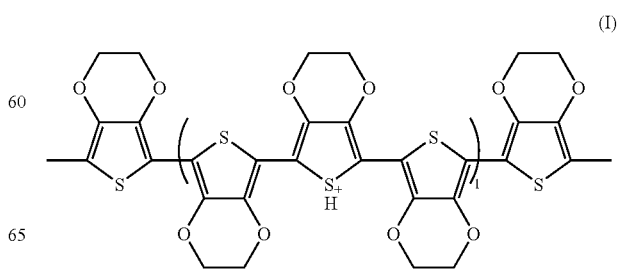

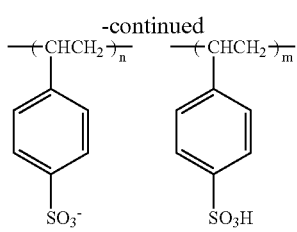

As represented by formula (II), in this composite structure, polyethylenedioxythiophene and polystyrenesulfonic acid are considered to be bonded to each other through a hydrogen bond to form an organic composite (referred to as "PEDOT/PSS"):

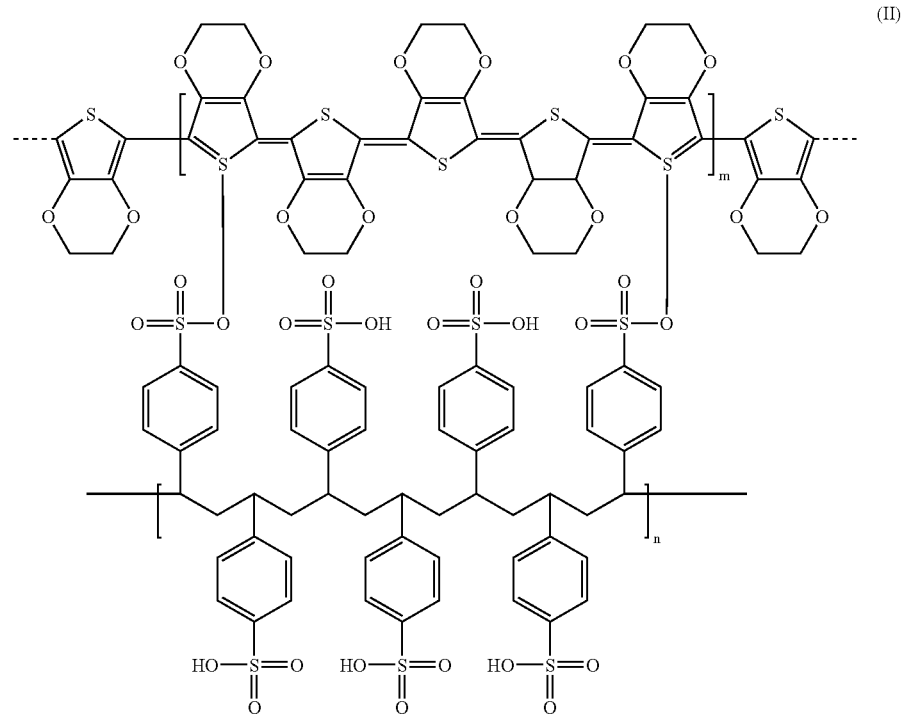

A mixture of 100 parts by mass of the powder with 38 parts by mass of phosphorus pentachloride was heated under reflux at 170° C. for 10 hr, was distilled, and was then developed in tetrahydrofuran. The insolubles were removed by filtration. 48 parts by mass of ethanol and 30 parts by mass of pyridine were added to the filtrate, and the mixture was stirred under reflux for 24 hr for esterification. After the completion of the esterification, the reaction mixture was filtered to remove insolubles. The solvent was removed from the filtrate by distillation to give 63 parts by mass of a powdery esterification product.

Evaluation Test 1

Evaluation 1-1: Solvent Solubility Test

The esterification product prepared above was measured for the solubility in 100 parts by mass of a solvent. The results are shown in Table 1 below. As shown in Table 1, it is understood that the powder before the treatment is rendered soluble in the solvent by the esterification.

TABLE 1

Solubility in solvent before and after esterification

| Solvent | Powder before treatment | Esterification product |
|---|---|---|
| Tetrahydrofuran | Insoluble | Soluble |
| Dichloroethane | Insoluble | Soluble |
| Toluene | Insoluble | Insoluble |

Evaluation 1-2: Film Formability Test

The esterification product prepared above was dissolved in dichloroethane to a concentration of 1% by mass. The solution was filtered through a 0.5-μm filter to prepare a coating liquid. The coating liquid was spin-coated onto a cleaned glass substrate with ITO. The coated substrate was heated on a hot plate of 200° C. for one hr to form an 800 angstrom-thick hole transport layer. The formed layer was free from any precipitate and was uniform.

Formation of Second Thin Film (Luminescent Layer)

A coating liquid having the following composition was further spin-coated onto the surface of the hole transport layer, and the coating was dried to form an 800 angstrom-thick luminescent layer.

| Composition for coating liquid | |
|---|---|
| Polyvinylcarbazole | 70 pts. mass |
| Oxadiazole | 30 pts. mass |
| Coumarin 6 | 1 pt. mass |
| Toluene | 4900 pts. mass |

Preparation of Pair of Electrodes

A calcium layer (thickness: 500 angstroms) as a cathode and a silver layer (thickness: 2,500 angstroms) as an anode were then formed by vacuum deposition on the surface of the luminescent layer to prepare an organic EL element of Example 1.

Comparative Example 1

An EL element of Comparative Example 1 was prepared in the same manner as in Example 1, except that the powder was not esterified.

Evaluation Test 2

Evaluation 2-1: Test On Emission Efficiency and Emission Lifetime of EL Element

The elements prepared in Example 1 and Comparative Example 1 were evaluated for element characteristics. As a result, for both the elements, upon the application of a DC voltage of 10 V, green luminescence occurred, and the maximum emission efficiency was 10 cd/A. That is, it was found that the luminescence characteristics of the EL element prepared in Example 1 was comparable to those of the EL element of Comparative Example 1 prepared by the conventional technique.

The EL elements of Example 1 and Comparative Example 1 were measured for emission life time. As a result, it was found that the emission life time of the EL element prepared in Example 1 was not less than 5 times that of the EL element prepared in Comparative Example 1.

Evaluation 2-2: Test on Residual Water in Hole Transport Layer

The hole transport layer formed in Example 1 and the hole transport layer formed in Comparative Example 1 were analyzed for the water content of the hole transport layer with TDS (thermal desorption analyzer) manufactured by ULVAC, Inc. The results are shown in Table 2 below. The water content was measured under conditions of measuring temperature range 50 to 450° C., temperature rise rate 60° C./min, and scan measurement. As is apparent from the results shown in Table 2 below, the water content of the hole transport layer in Example 1 is significantly smaller than the water content of the hole transport layer in Comparative Example 1. Specifically, in the measured mass number 18 ($H_2O$), the water content for Example 1 is 1.32/119 (0.01%) of the water content in Comparative Example 1. Thus, it is understood that the low water content of the hole transport layer results in a much longer service life of the element prepared in Example 1 than the service life of the element prepared in Comparative Example 1.

TABLE 2

| Residual water in hole transport layer (measured mass number M/z = 18) | |
|---|---|
| Example 1 | Comparative Example 1 |
| $1.32 \times 10^{15}$ | $1.19 \times 10^{17}$ |

Example 2

Formation of First Thin Film (Hole Transport Layer)

The procedure of Example 1 was repeated, except that, in the esterification in the formation of the first thin film (hole transport layer) in Example 1, 100 parts by mass of sodium salt of poly[2-(3-thienyl)ethyloxy-4-butylsulfonate] (manufactured by American Dye Source, Inc.) was used as a starting powder, and 30 parts by mass of methanol was used as the alcohol for esterification. Thus, 22 parts by mass of a powdery esterification product was obtained. Sodium salt of poly[2-(3-thienyl)ethyloxy-4-butylsulfonate] has a chemical structure represented by formula (III):

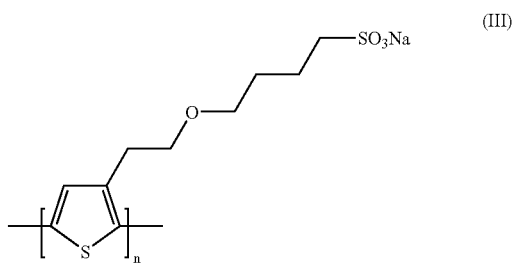

Evaluation Test 3

Evaluation 3-1: Test On Solubility in Solvent

The esterification product prepared above was measured for the solubility in 100 parts by mass of a solvent. The results are shown in Table 3 below. As shown in Table 3, it is understood that the powder before the treatment is rendered soluble in the solvent by the esterification.

TABLE 3

| Solubility in solvent before and after esterification | | |
|---|---|---|
| Solvent | Powder before treatment | Esterification product |
| Tetrahydrofuran | Insoluble | Soluble |
| Dichloroethane | Insoluble | Soluble |
| Toluene | Insoluble | Insoluble |

Evaluation 3-2: Film Formability Test

The esterification product prepared above was dissolved in dichloroethane to a concentration of 1% by mass. The solution was filtered through a 0.5-µm filter to prepare a coating liquid. The coating liquid was spin-coated onto a cleaned glass substrate with ITO. The coated substrate was heated on a hot plate of 200° C. for one hr to form an 800 angstrom-thick hole transport layer. The formed layer was free from any precipitate and was uniform.

Formation of Second Thin Film (Luminescent Layer)

A coating liquid having the following composition was further spin-coated onto the surface of the hole transport layer prepared above, and the coating was dried to form an 800 angstrom-thick luminescent layer.

| Composition for coating liquid | |
|---|---|
| Polyvinylcarbazole | 70 pts. mass |
| Oxadiazole | 30 pts. mass |
| Coumarin 6 | 1 pt. mass |
| Toluene | 4900 pts. mass |

Preparation of Pair of Electrodes

A calcium layer (thickness: 500 angstroms) as a cathode and a silver layer (thickness: 2,500 angstroms) as an anode were then formed by vacuum deposition on the surface of the luminescent layer to prepare an organic EL element of Example 2.

Comparative Example 2

An EL element of Comparative Example 2 was prepared in the same manner as in Example 2, except that sodium salt of poly[2-(3-thienyl)ethyloxy-4-butylsulfonate] was not esterified and was used as an aqueous solution having a solid content of 1% by mass.

Evaluation Test 4

Evaluation 4-1: Test On Emission Efficiency and Emission Lifetime of EL Element

The elements prepared in Example 2 and Comparative Example 2 were evaluated for element characteristics. As a result, for both the elements, upon the application of a DC voltage of 10 V, green luminescence occurred, and the maximum emission efficiency was 6 cd/A. That is, it was found that the luminescence characteristics of the EL element prepared in Example 2 was comparable to those of the EL element of Comparative Example 2 prepared by the conventional technique.

The EL elements of Example 2 and Comparative Example 2 were measured for emission life time. As a result, it was found that the emission life time of the EL element prepared in Example 2 was not less than twice that of the EL element prepared in Comparative Example 2.

Evaluation 4-2: Test On Residual Water In Hole Transport Layer

The hole transport layer formed in Example 2 and the hole transport layer formed in Comparative Example 2 were analyzed for the water content of the hole transport layer with TDS (thermal desorption analyzer) manufactured by ULVAC, Inc. The results are shown in Table 4 below. The water content was measured under conditions of measuring temperature range 50 to 450° C., temperature rise rate 60° C./min, and scan measurement.

As is apparent from the results shown in Table 4 below, the water content of the hole transport layer in Example 2 is significantly smaller than the water content of the hole transport layer in Comparative Example 2. Specifically, in the measured mass number 18 ($H_2O$), the water content for Example 2 is 2.53/1390 (0.002%) of the water content in Comparative Example 2. Thus, it is understood that the low water content of the hole transport layer results in a much longer service life of the element prepared in Example 2 than the service life of the element prepared in Comparative Example 2.

TABLE 4

| Residual water in hole transport layer (measured mass number M/z = 18) | |
|---|---|
| Example 2 | Comparative Example 2 |
| $2.53 \times 10^{14}$ | $1.39 \times 10^{17}$ |

The invention claimed is:

1. An electroluminescent element comprising:
a substrate; and, provided on the substrate in the following order, a first thin film as a carrier transport layer, and a second thin film as a luminescent layer,
said first thin film being formed of a hydrophilic organic material,
said hydrophilic organic material having hydrophilic groups which have been partially or wholly converted to lipophilic groups, said lipophilic groups being partially or wholly returned to hydrophilic groups upon exposure to heat energy or a radiation,
said second thin film being formed of a lipophilic organic material.

2. The electroluminescent element according to claim 1, wherein the hydrophilic group in the hydrophilic organic material is a sulfonic acid group, a carboxyl group, or a salt thereof.

3. The electroluminescent element according to claim 1, wherein said hydrophilic organic material is polystyrene sulfonic acid or a derivative thereof, or an organic material containing polystyrene sulfonic acid or a derivative thereof.

4. The electroluminescent element according to claim 1, wherein the hydrophilic organic material is polythiophenesulfonic acid or a derivative thereof, or an organic material containing polythiophenesulfonic acid or a derivative thereof.

5. The electroluminescent element according to claim 1, wherein a protection reaction is used as means for converting the hydrophilic groups in the hydrophilic organic material to lipophilic groups.

6. The electroluminescent element according to claim 1, wherein the protection reaction is at least one member selected from the group consisting of esterification, acetylation, tosylation, tritylation, alkylsilylation, and alkylcarbonylation.

7. The electroluminescent element according to claim 1, wherein said carrier transport layer is an electron transport layer or a hole transport layer.

8. The electroluminescent element according to claim 1, which further comprises a pair of opposed electrodes for holding the carrier transport layer and the luminescent layer therebetween.

9. The electroluminescent element according to claim 1, wherein the number of water molecules (mass number: 18) contained in the hole transport layer is $1.0 \times 10^{16}$ or less in a temperature range of 50 to 450° C.

10. A liquid composition for formation of the first thin film as a carrier transport layer of the electroluminescent element according to claim 1,
said liquid composition comprising a hydrophilic organic material,
said hydrophilic organic material having hydrophilic groups which have been partially or wholly converted to lipophilic groups, said lipophilic groups being partially or wholly returned to hydrophilic groups upon exposure to heat energy or a radiation.

11. The liquid composition according to claim 10, wherein said electroluminescent element comprises a first thin film formed of the hydrophilic organic material and a second thin film formed of a lipophilic organic material.

12. The liquid composition according to claim 10, wherein the hydrophilic group in the hydrophilic organic material is a sulfonic acid group, a carboxyl group, or a salt thereof.

13. The liquid composition according to claim 10, wherein said hydrophilic organic material is polystyrene sulfonic acid or a derivative thereof, or an organic material containing polystyrene sulfonic acid or a derivative thereof.

14. The liquid composition according to claim 10, wherein the hydrophilic organic material is polythiophenesulfonic acid or a derivative thereof, or an organic material containing polythiophenesulfonic acid or a derivative thereof.

15. The liquid composition according to claim 10, wherein a protection reaction is used as means for converting the hydrophilic groups in the hydrophilic organic material to lipophilic groups.

16. The liquid composition according to claim 10, wherein the protection reaction is at least one member selected from the group consisting of esterification, acetylation, tosylation, tritylation, alkylsilylation, and alkylcarbonylation.

* * * * *